(12) United States Patent
Homma et al.

(10) Patent No.: US 9,070,857 B2
(45) Date of Patent: Jun. 30, 2015

(54) PIEZOELECTRIC ELEMENT

(75) Inventors: Mitsunao Homma, Tokyo (JP);
Yasuyuki Sato, Tokyo (JP)

(73) Assignee: TDK CORPORATION, Tokyo (JP)

( * ) Notice: Subject to any disclaimer, the term of this patent is extended or adjusted under 35 U.S.C. 154(b) by 260 days.

(21) Appl. No.: 13/534,714

(22) Filed: Jun. 27, 2012

(65) Prior Publication Data

US 2013/0002097 A1 Jan. 3, 2013

(30) Foreign Application Priority Data

Jun. 30, 2011 (JP) ................................ P2011-145558

(51) Int. Cl.
*H01L 41/08* (2006.01)
*H01L 41/047* (2006.01)
*H01L 41/083* (2006.01)

(52) U.S. Cl.
CPC ........ *H01L 41/0472* (2013.01); *H01L 41/0471* (2013.01); *H01L 41/0833* (2013.01)

(58) Field of Classification Search
CPC ............ H01L 41/0471; H01L 41/0472; H01L 41/04833
USPC .......... 310/328, 364, 365, 366, 368, 367, 311
IPC .................. H01L 41/08, 41/04, 41/047, 41/107
See application file for complete search history.

(56) References Cited

U.S. PATENT DOCUMENTS

| | | | |
|---|---|---|---|
| 5,089,739 A * | 2/1992 | Takahashi et al. | 310/328 |
| 6,724,129 B2 | 4/2004 | Nakatani | |
| 6,747,398 B2 * | 6/2004 | Nakatani | 310/366 |
| 7,211,930 B2 * | 5/2007 | Homma | 310/366 |
| 7,429,817 B2 * | 9/2008 | Asano et al. | 310/364 |
| 7,594,309 B2 * | 9/2009 | Iwase et al. | 310/328 |
| 7,969,066 B2 * | 6/2011 | Kasai et al. | 310/364 |

FOREIGN PATENT DOCUMENTS

| | | | | |
|---|---|---|---|---|
| JP | A-2003-37307 | 2/2003 | | |
| JP | 2006-245026 | * 9/2006 | ............ | H01L 41/083 |
| JP | A-2006-245026 | 9/2006 | | |
| JP | A-2007-157849 | 6/2007 | | |
| WO | WO 2009/096381 A1 | 8/2009 | | |

* cited by examiner

*Primary Examiner* — Thomas Dougherty
*Assistant Examiner* — Karen B Addison
(74) *Attorney, Agent, or Firm* — Oliff PLC

(57) ABSTRACT

A laminated piezoelectric element includes a base part that is configured from a piezoelectric layer, and a laminate configured by a first internal electrode and a second internal electrode, which are alternately laminated with the piezoelectric layer interposed therebetween, and that includes a displacement part extending from the base part in a laminating direction of the first internal electrode and the second internal electrode.

3 Claims, 9 Drawing Sheets

(a)

(b)

PIEZOELECTRIC ELEMENT

BACKGROUND OF THE INVENTION

1. Field of the Invention

The present invention relates to a piezoelectric element.

2. Related Background Art

As an example of a conventional laminated piezoelectric element, for instance, known is a type described in Japanese Patent Application Publication No. 2003-37307. The laminated piezoelectric element described in Japanese Patent Application Publication No. 2003-37307 comprises a laminate including driving part in which a piezoelectric layer and first and second driving internal electrodes are alternatively laminated and a connecting part in which the piezoelectric layer and a connecting internal electrode are laminated, a driving external electrode formed on one side face of the laminate and which conducts with the first driving internal electrode, a connecting external electrode formed on one side face of the laminate and which conducts with the connecting internal electrode, and a common external electrode formed on another face of the laminate and which conducts with the second driving internal electrode and the connecting internal electrode. Configured on the driving part is a displacement part (actuator part) based on a slit formed along the laminating direction of the piezoelectric layer from the top face side toward the bottom face side of the laminate.

Meanwhile, the displacement part has a width of roughly several ten μm. Thus, upon forming the displacement part or handling the piezoelectric element, there are cases where the displacement part breaks from the base end part side. In particular, the displacement part tends to break at the bonding portion of the piezoelectric layer and the internal electrode on the base end part side. In connection with this problem, if the displacement part is formed wide to prevent the displacement part from breaking, the capacitance will increase pursuant to the increase in the opposing area of the internal electrode. Consequently, there is a problem in that the current will increase and the power consumption will also increase.

SUMMARY OF THE INVENTION

The present invention was devised to resolve the foregoing problems, and an object of this invention is to provide a piezoelectric element capable of preventing the displacement part from becoming damaged while inhibiting the power consumption from increasing.

In order to achieve the foregoing object, the piezoelectric element according to the present invention includes a base part that is configured from a piezoelectric layer, and a laminate that is configured by a first internal electrode and a second internal electrode, which are alternately laminated with the piezoelectric layer interposed therebetween, and that includes a displacement part extending from the base part in a laminating direction of the first internal electrode and the second internal electrode. The displacement part has a shape in which, when viewed from the laminating direction, a length of a first direction which is orthogonal to the laminating direction is longer than a length of a second direction which is orthogonal to the first direction and the laminating direction. The first internal electrode and the second internal electrode include a first portion in which the first internal electrode and the second internal electrode overlap in the laminating direction, and a second portion in which the first internal electrode and the second internal electrode do not overlap in the laminating direction, and an opening is formed in the second portion.

With this piezoelectric element, an opening is formed in a second portion where the first internal electrode and the second internal electrode do not overlap in the laminating direction. Since the first and second internal electrodes and the piezoelectric layer are made of different materials, the bonding strength of the first and second internal electrodes and the piezoelectric layer is low in comparison to the bonding strength when the piezoelectric layers are bonded. Thus, as a result of forming an opening and bonding the piezoelectric layers that face each other across the first internal electrode or the second internal electrode via the opening, the bonding area (contact area) of the piezoelectric layers can be increased. Accordingly, it is possible to secure the bonding strength at the displacement part and prevent the displacement part from becoming damaged. Moreover, since the strength of the displacement part can be secured without having to the broaden the width of the displacement part, it is possible to inhibit the opposing area of the internal electrodes from increasing in comparison to the case of securing the strength of the displacement part by broadening the overall width of the displacement part, and it is thereby possible to inhibit the capacitance from increasing. Consequently, it is possible to inhibit the current from increasing, and also inhibit the power consumption from increasing.

The opening is formed in the first internal electrode and the second internal electrode disposed on the base part side of the displacement part. As a result of forming the opening on the base end part side of the displacement part that is easily damage, it is possible to prevent the base end part side of the displacement part from becoming damaged.

An opening is formed in the first portion of the first internal electrode and the second internal electrode disposed on the base part side of the displacement part. According to the foregoing configuration, the bonding area of the piezoelectric layers can be increased on the base part side of the displacement part. Accordingly, it is possible to secure the strength on the base end part side of the displacement part, and further prevent the displacement part from becoming damaged.

According to the present invention, it is possible to prevent the displacement part from becoming damaged while realizing a low-power consumption design.

Figure 1:
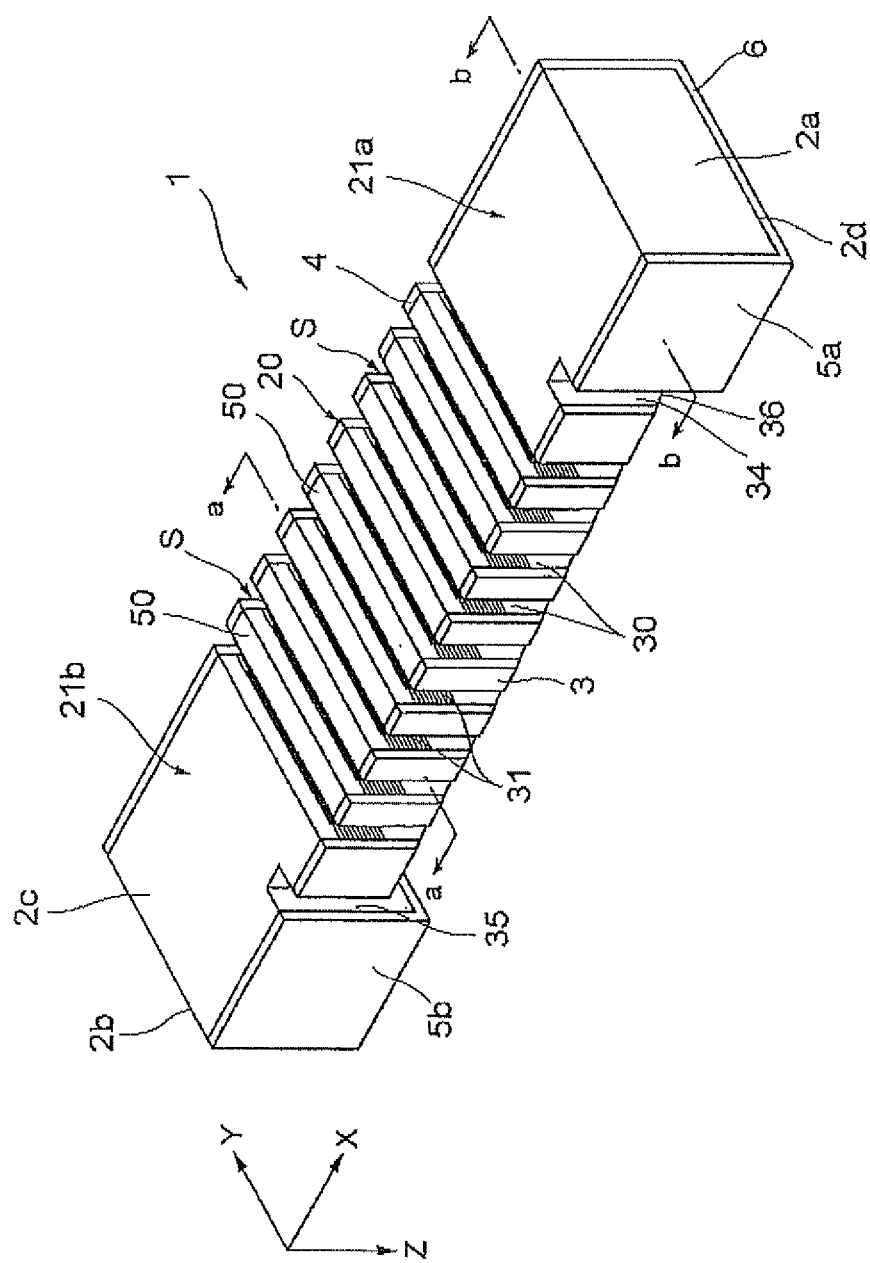
FIG. 1 is a perspective view showing the laminated piezoelectric element according to the first embodiment.
Figure 3:
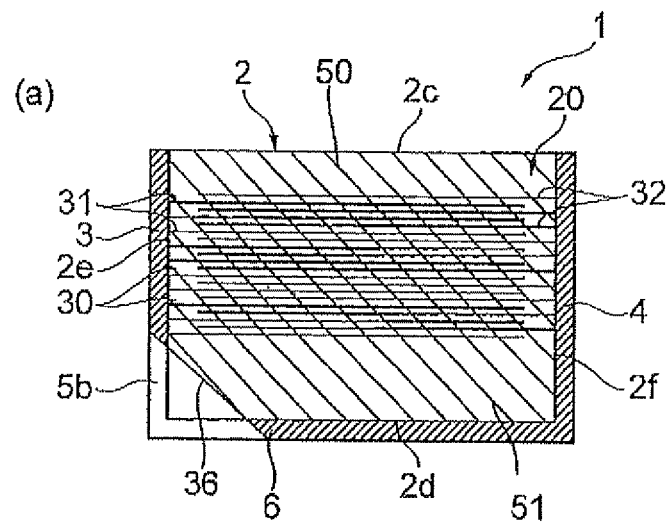
Figure 3:
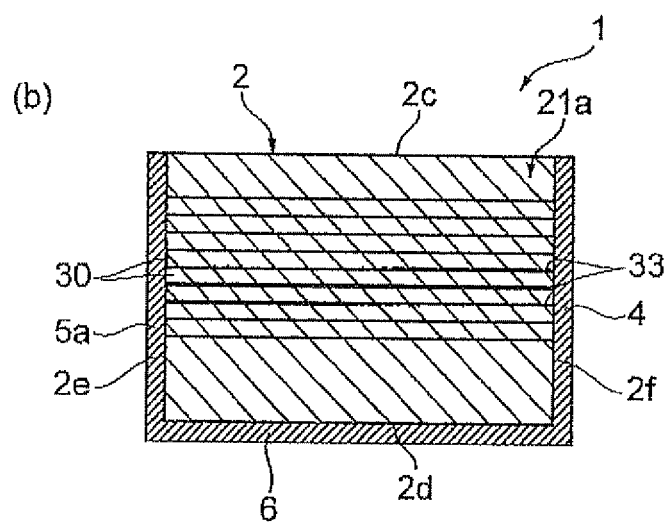
Figure 4:
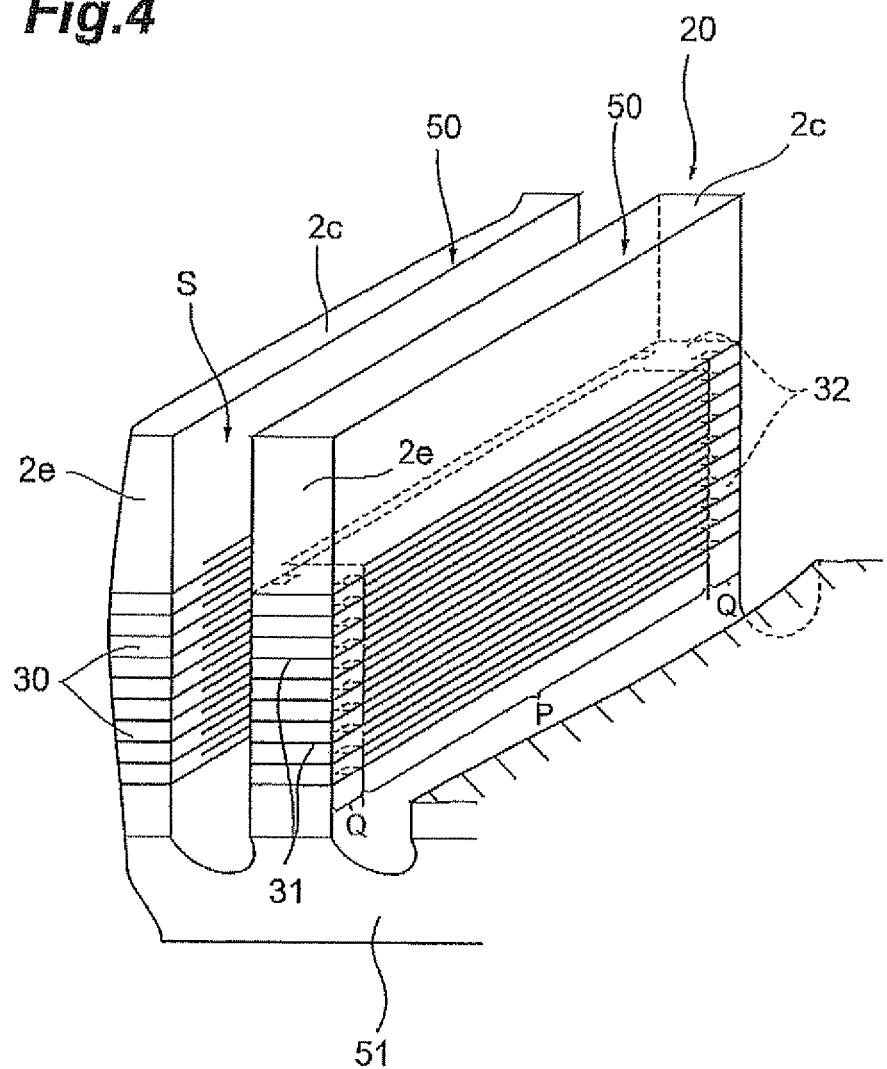
Figure 5:
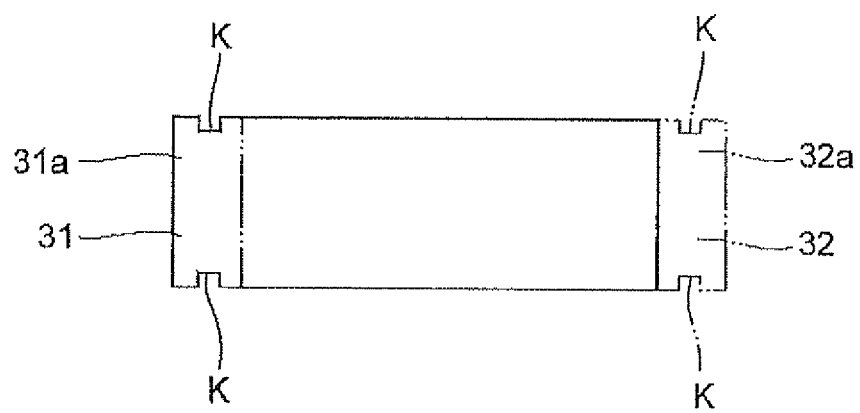
Figure 6:
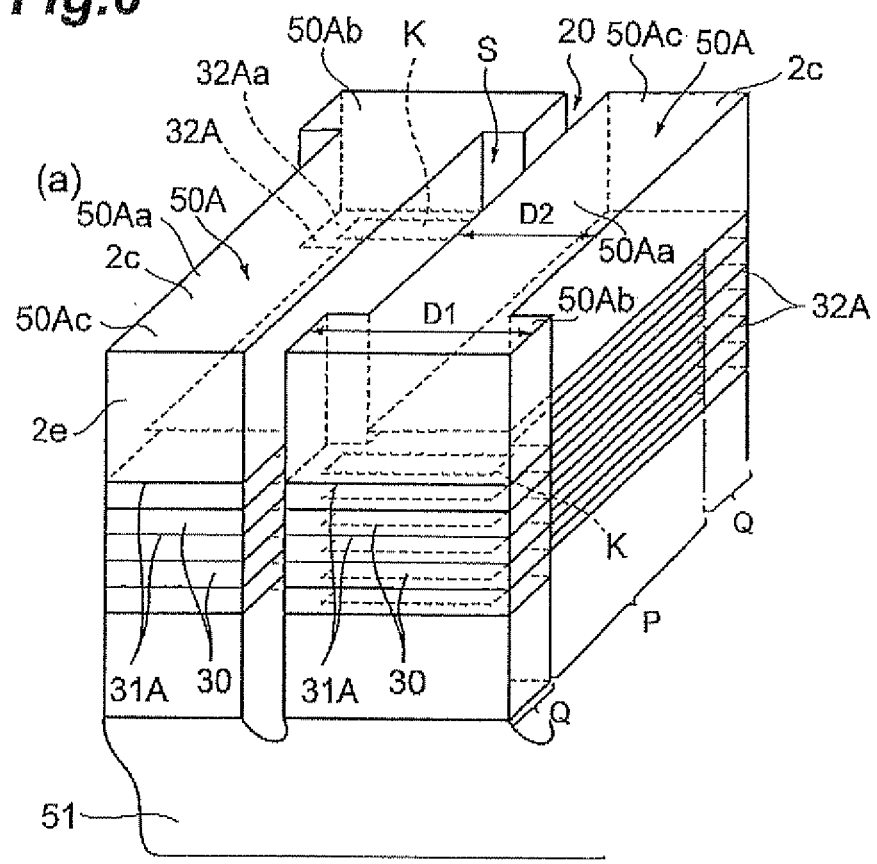
Figure 6:
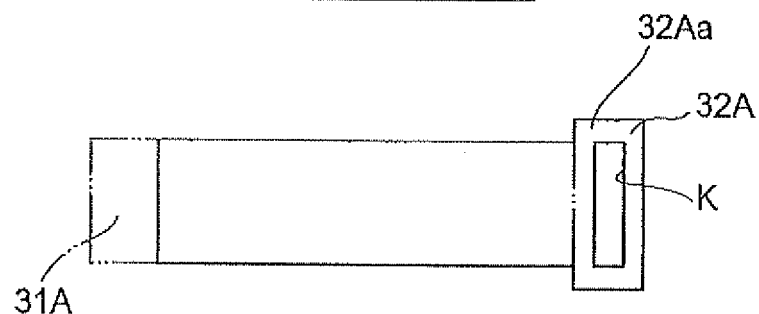
Figure 6:
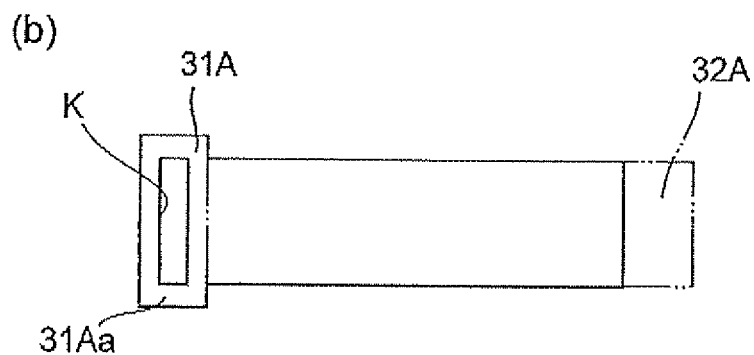
Figure 7:
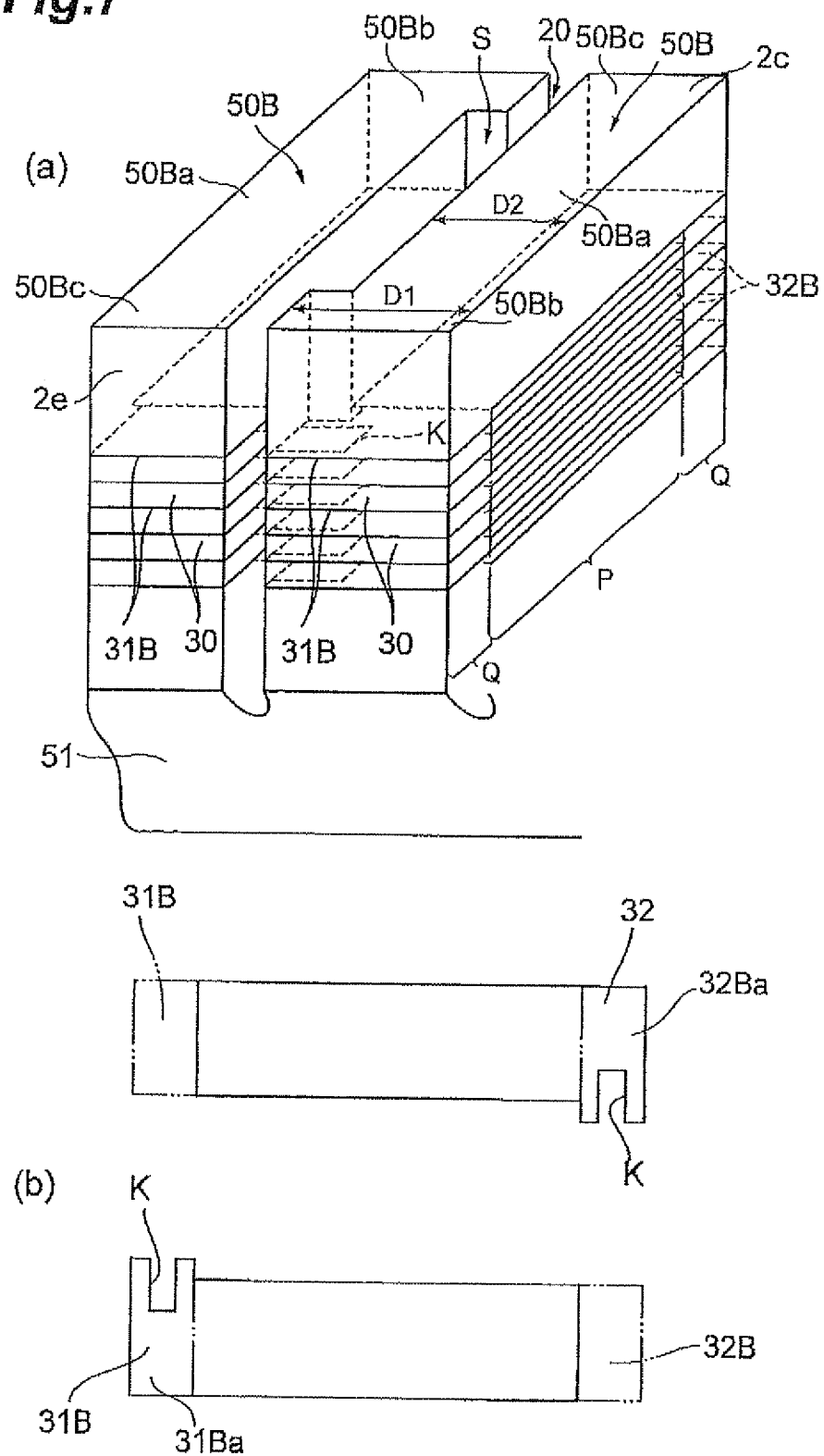
Figure 8:
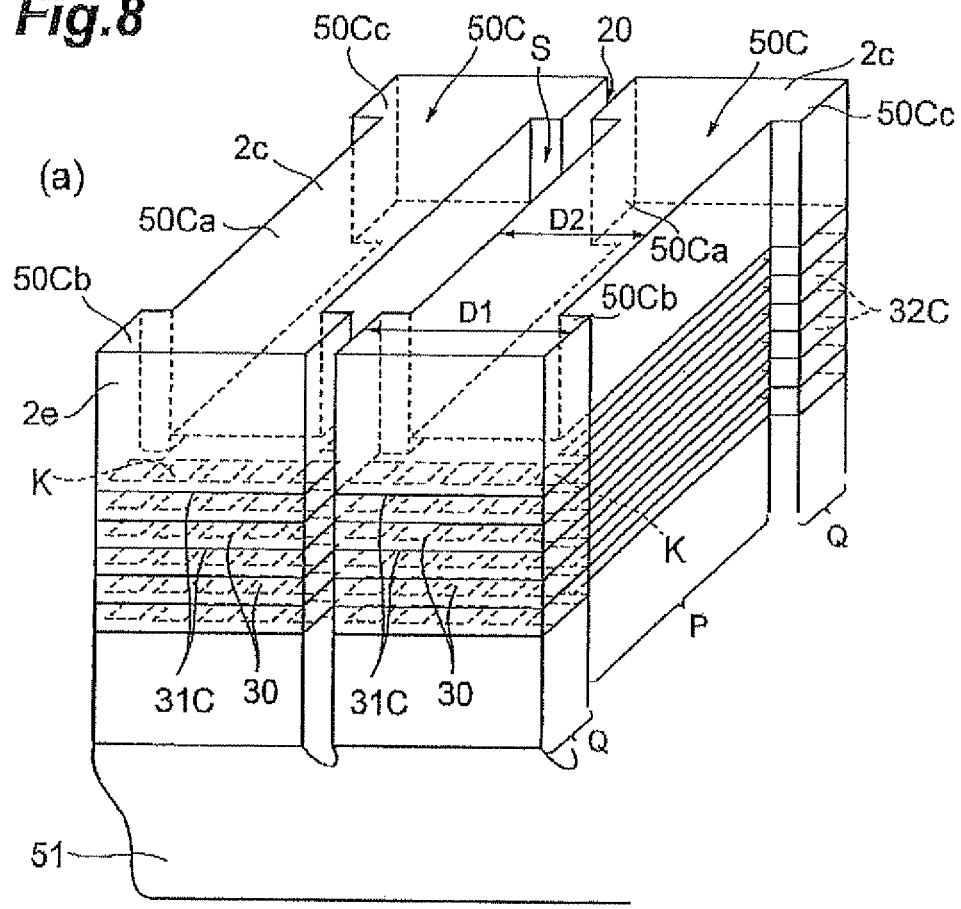
Figure 8:
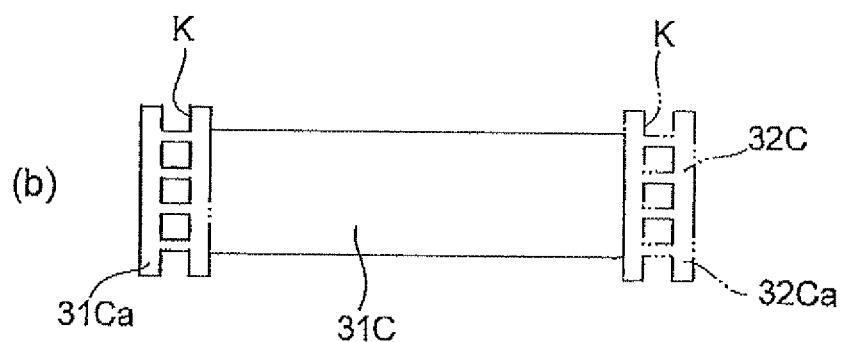
Figure 9:
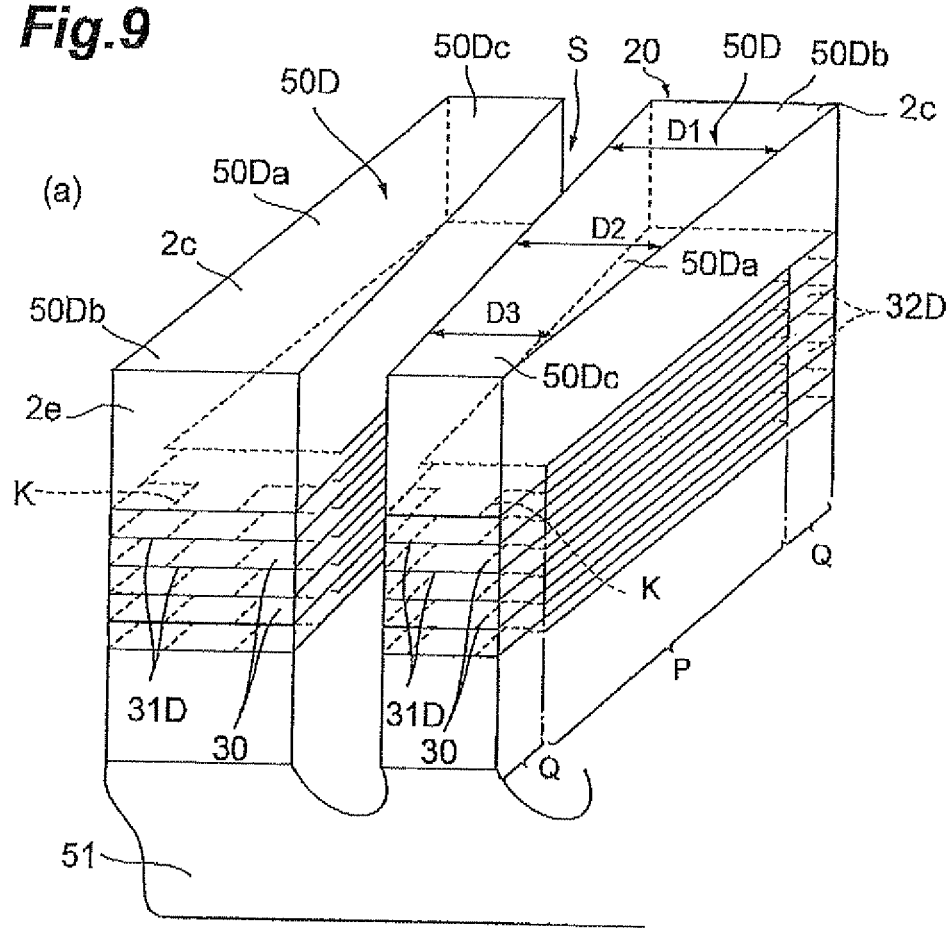
Figure 9:
Figure 9:

(a) of FIG. 3 is a cross section of line a-a in FIG. 1, and (b) of FIG. 3 is a cross section of line b-b in FIG. 1;

FIG. 4 is a perspective view showing a close-up of the displacement part;

FIG. 5 is a diagram showing the configuration of the first internal electrode and the second internal electrode;

(a) of FIG. 6 is a perspective view showing the displacement part of the laminated piezoelectric element according to the second embodiment, and (b) of FIG. 6 is a diagram showing the configuration of the internal electrode disposed in the displacement part illustrated in (a) of FIG. 6;

(a) of FIG. 7 is a perspective view showing the displacement part of the laminated piezoelectric element according to the third embodiment, and (b) of FIG. 7 is a diagram showing the configuration of the internal electrode disposed in the displacement part illustrated in (a) of FIG. 7;

(a) of FIG. 8 is a perspective view showing the displacement part of the laminated piezoelectric element according to the fourth embodiment, and (b) of FIG. 8 is a diagram showing the configuration of the internal electrode disposed in the displacement part illustrated in (a) of FIG. 8; and (a) of FIG. 9 is a perspective view showing the displacement part of the laminated piezoelectric element according to the fifth embodiment, and (b) of FIG. 9 is a diagram showing the configuration of the internal electrode disposed in the displacement part illustrated in (a) of FIG. 9.

DESCRIPTION OF THE PREFERRED EMBODIMENTS

Embodiments of the present invention are now explained in detail with reference to the appended drawings. Note that the same or equivalent elements are given the same reference numeral in the explanation of the drawings, and the redundant explanation thereof is omitted.

First Embodiment

Figure 2:
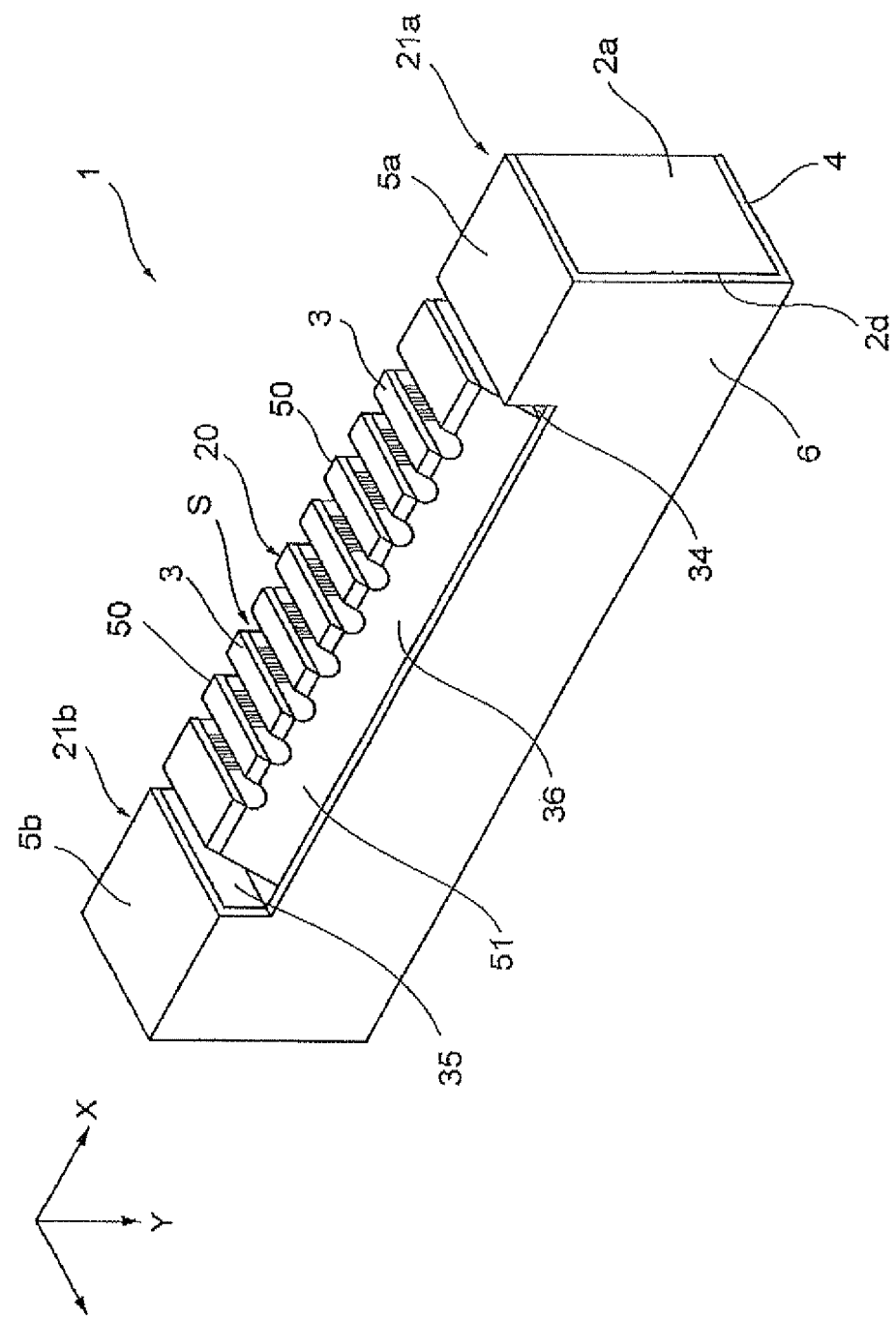
FIG. 2 is a perspective view of the laminated piezoelectric element shown in FIG. 1 when viewed from below.

FIG. 1 is a perspective view showing the laminated piezoelectric element according to the first embodiment. FIG. 2 is a perspective view of the laminated piezoelectric element shown in FIG. 1 when viewed from below. (a) of FIG. 3 is a cross section of line a-a in FIG. 1, and (b) of FIG. 3 is a cross section of line b-b in FIG. 1.

As shown in the respective diagrams, a laminated piezoelectric element 1 includes a laminate 2, a first external electrode 3, a second external electrode 4, third external electrodes 5a, 5b, and a fourth external electrode 6. With the laminated piezoelectric element 1, for example, the length is set to roughly 36.95 mm to 37.05 mm, the width is set to roughly 1.85 mm to 1.95 mm, and the thickness is set to roughly 0.95 mm to 1.05 mm.

The laminate 2 includes a pair of first and second end faces 2a, 2b in which the first and second end faces 2a, 2b face each other and are mutually parallel in the longitudinal direction of the laminate 2, a pair of first and second main faces 2c, 2d in which the first and second main faces 2c, 2d extend so as to connect the pair of first and second end faces 2a, 2b and face each other in the laminating direction of a piezoelectric layer 30 (described later), and a pair of first and second side faces 2e, 2f in which the first and second side faces 2e, 2f extend so as to connect the pair of first and second main faces 2c, 2d and face each other. In FIG. 1, the opposing direction of the pair of first and second end faces 2a, 2b is indicated as the X direction, the opposing direction of the pair of first and second side faces 2e, 2f is indicated as the Y direction, and the opposing direction of the pair of first and second main faces 2c, 2d is indicated as the Z direction.

The laminate 2 includes a first portion 20, a second portion 21a, and a third portion 21b. The first portion 20 is a portion including an active part (active region) which is piezoelectrically active, and positioned between the first and second end faces 2a, 2b in the laminate 2. Specifically, the first portion 20 is positioned at the center portion of the laminate 2.

As shown in FIG. 4, a displacement part 50 is formed on the first portion 20. The displacement part 50 is extending from the base part 51 (erected from the base part 51) which is configured from a piezoelectric layer 30. The displacement part 50 and the base part 51 are formed integrally. The displacement part 50 is configured by a first internal electrode 31 and a second internal electrode 32 being alternately laminated with the piezoelectric layer 30 interposed therebetween. In other words, the displacement part 50 extends from the base part 51 along the laminating direction of the first internal electrode 31 and the second internal electrode 32 (hereinafter simply referred to as the "laminating direction"). Each piezoelectric layer 30 is configured, from example, a piezoelectric ceramic material having lead zirconate titanate (PZT:Pb($Z_{rx}$, $Ti_{1-x}$)$O_3$) as its main component. With an actual laminated piezoelectric element 1, the respective piezoelectric layers 30 are integrated to a level where the lamination cannot be visually confirmed. In this embodiment, the thickness of the respective piezoelectric layers 30 is roughly 10 μm to 50 μm.

The displacement part 50 is arranged in a plurality (eight in this example) in the X direction, and separated at predetermined intervals. The displacement part 50 has an oblong shape when viewed from the laminating direction (Z direction), and the length of the first direction (Y direction) which is orthogonal to the laminating direction is longer than the length of the second direction (X direction) which is orthogonal to the first direction and the laminating direction. Moreover, the displacement part 50 has a substantially rectangular shape when viewed from the first direction.

A plurality of slits S (nine in this example) are formed at even intervals between the adjacent displacement parts 50. The slit S is open to the first main face 2c side, and formed to extend in the opposing direction of the first side face 2e and the second side face 2f.

The first internal electrode 31 is disposed in a plurality (ten in this example) in the laminating direction at predetermined intervals. One end of the first internal electrode 31 is drawn out to the first side face 2e and exposed on the first side face 2e. The second internal electrode 32 is disposed in a plurality (ten in this example) in the laminating direction at predetermined intervals. One end of the second internal electrode 32 is drawn out to the second side face 2f and exposed on the second side face 2f. The first internal electrode 31 and the second internal electrode 32 are made of a conductive material having silver (Ag) and palladium (Pd) as its main component. In this embodiment, the thickness of the first internal electrode 31 and the second internal electrode 32 is roughly 0.5 μm to 3 μm. Note that Cu (copper) may also be used as the conductive material.

As shown in FIG. 4, the first internal electrode 31 and the second internal electrode 32 include a first portion P in which the first internal electrode 31 and the second internal electrode 32 overlap in the laminating direction, and a second portion Q in which the first internal electrode 31 and the second internal electrode 32 do not overlap in the laminating direction. The first portion P is a portion which corresponds to the active part in the displacement part 50, and the second portion Q is a portion which corresponds to the inactive part in the displacement part 50. FIG. 4 shows the portions corresponding to the first portion P and the second portion Q in the displacement part 50.

As shown in FIG. 4 and FIG. 5, an opening K is formed in the second portion Q of the first internal electrode 31; that is, on an end part 31a on the first side face 2e side. The opening K is provided in a plurality (two in this example) on either end of the first internal electrode 31 in the width direction. The opening K is formed in the second portion Q of the second internal electrode 32; that is, on an end part 32a on the second side face 2f side. The opening K is provided in a plurality (two in this example) on either end of the second internal electrode 32 in the width direction.

The first internal electrode 31 and the second internal electrode 32 are alternately disposed along the opposing direction of the piezoelectric layer 30 so as to face each other across the piezoelectric layer 30. When viewed from the laminating direction, the second internal electrode 32 is positioned on the first main face 2c side, and the second internal electrode 32 is positioned on the second main face 2d side.

A second portion 21a and a third portion 21b are portions including an inactive part (inactive region) which is piezoelectrically inactive, and positioned respectively on the first end face 2a side and the second end face 2b side of the laminate 2. In other words, the second portion 21a and the third portion 21b are provided so as to sandwich the first portion 20 in the longitudinal direction of the laminate 2 (opposing direction of the first and second end faces 2a, 2b). The second portion 21a and the third portion 21b are configured by a plurality of piezoelectric layers 30 and the third internal electrode 33 being alternately laminated. The second portion 21a and the third portion 21b are configured similarly.

The third internal electrode 33 is disposed in a plurality (nine layers in this example) in the laminating direction of the piezoelectric layers 30 at predetermined intervals. One end of the third internal electrode 33 is drawn out to the first side face 2e, the other end is drawn out to the second side face 2f, and exposed on the first side face 2e and the second side face 2f. The third internal electrode 33 is physically and electrically insulated from the first internal electrode 31 and the second internal electrode 32. The third internal electrode 33 is a connecting electrode for connecting the second external electrode 4 and the third external electrodes 5a, 5b. The third internal electrode 33 is made of a conductive material having silver (Ag) and palladium (Pd) as its main component. In this embodiment, the thickness of the third internal electrode 33 is roughly 0.5 μm to 3 μm.

The first external electrode 3 is provided to the first side face 2e. The first external electrode 3 is formed at a position corresponding to the first portion 20 on the first side face 2e, and physically and electrically connected to one end of the first internal electrode 31. The respective first external electrodes 3 are mutually physically and electrically independent. The first external electrode 3 is formed from three layers of metal films of Cr, Cu/Ni, Au. The thickness of the first external electrode 3 is roughly 0.3 μm to 5.0 μm. The configuration of this external electrode also applied to the second to fourth external electrodes 4 to 6. Note that a metal film of Ag, or Ag—Pd, Ag—Sn may be used in substitute for the metal film of Au.

The second external electrode 4 is provided to the second side face 2f. The second external electrode 4 is formed across the entire surface of the second side face 2f, and physically and electrically connected to one end of the second internal electrode 32 and the third internal electrode 33. The second external electrode 4 is a common external electrode that is connected to both the second internal electrode 32 and the third internal electrode 33. The second external electrode 4 is formed in a shape corresponding to the shape of the displacement part 50, and has a concavo-convex shape at the position corresponding to the displacement part 50.

The third external electrodes 5a, 5b are provided to the first side face 2e. The third external electrodes 5a, 5b are formed at positions corresponding to the second portion 21a and the third portion 21b on the first side face 2e; that is, on either end side of the first side face 2e in the longitudinal direction, and physically and electrically connected to one end of the third internal electrode 33. The third external electrodes 5a, 5b and the first external electrode 3 are electrically insulated from each other on the first side face 2e.

The fourth external electrode 6 is provided to the second main face 2d. The fourth external electrode 6 is formed across the entire surface of the second main face 2d, and physically and electrically connected to the second external electrode 4 and the third external electrodes 5a, 5b. In other words, the fourth external electrode 6 electrically connects the second external electrode 4 and the third external electrodes 5a, 5b. The fourth external electrode 6 is electrically insulated from the first external electrode 3. The fourth external electrode 6 is a connecting electrode for connecting the second external electrode 4 and the third external electrodes 5a, 5b. Moreover, the fourth external electrode 6 becomes the connecting face upon being connected to a substrate (support) or the like via a conductive adhesive.

Grooves 34, 35 are respectively formed between the first external electrode 3 and the third external electrodes 5a, 5b. In other words, the grooves 34, 35 are formed at the boundary portion of the first portion 20 and the second portion 21a and the third portion 21b. The grooves 34, 35 are formed along the laminating direction on the first side face 2e of the laminate 2. The first external electrode 3 and the third external electrodes 5a, 5b are physically and electrically insulated based on the grooves 34, 35.

A notch part 36 is provided to the corner portion of the side face 2e and the main face 2d at the first portion 20 of the laminate 2. The notch part 36 is formed along the longitudinal direction of the laminate 2 at the corner portion of the side face 2e and the main face 2d, and provided between the groove 34 and the groove 35. The notch part 36 is an inclined surface that is inclined relative to the side face 2e and the main face 2d. The first external electrode 3 and the fourth external electrode 6 are physically and electrically insulated based on the notch part 36.

With the laminated piezoelectric element 1, when voltage is applied between the first external electrode 3 and the second external electrode 4, voltage is also applied between the first internal electrode 31 and the second internal electrode 32. In addition, with the displacement part 50 (first portion 20), an electric field is generated in the region between the first internal electrode 31 and the second internal electrode 32 in the piezoelectric layer 30, and that region is displaced. Here, with the second portion 21a and the third portion 21b, since an electric field is not generated between the third internal electrodes 33 in the piezoelectric layer 30, no displacement is generated.

The method of manufacturing the laminated piezoelectric element 1 having the foregoing configuration is now explained.

Foremost, an organic binder, an organic solvent or the like is mixed to a piezoelectric ceramic material having lead zirconate titanate as its main component to prepare a base substance paste, and a green sheet to become the piezoelectric layer 30 is molded using the foregoing base substance paste based on the doctor blade method. Moreover, an organic binder, an organic solvent or the like is mixed to a metal material made of silver and palladium of a predetermined ratio to prepare a conductive paste for forming an electrode pattern.

Subsequently, by using the foregoing conductive paste, electrode patterns corresponding to the first to third internal electrodes 31 to 33 are respectively formed on the green sheet based on the screen printing method. In addition, the green sheet formed with an electrode pattern corresponding to the first internal electrode 31 and the third internal electrode 33, the green sheet formed with an electrode pattern corresponding to the second internal electrode 32 and the third internal electrode 33, and the green sheet to become the piezoelectric layer 30 are laminated to prepare a laminate green.

Subsequently, the laminate green is pressed in the laminating direction at a predetermined pressure while heating the laminate green at a predetermined temperature (for instance, at roughly 60° C.), and the laminate green is thereafter cut into a predetermined size. In addition, after degreasing the laminate green at a predetermined temperature (for instance, at roughly 400° C.), the laminate green is calcined at a predetermined temperature (for instance, at roughly 1100° C.) for a predetermined time to obtain a laminate 2.

Subsequently, three layers of metal films in the order of Cr, Au are formed via the sputtering method on the surfaces corresponding to the side faces 2e, 2f and the main face 2d of the laminate 2 in order to form an external electrode. In addition, by forming the grooves 34, 35 along the laminating direction on the surface corresponding to the side face 2e in the laminate 2, the external electrode is divided so as to form the first external electrode 3 and the third external electrodes 5a, 5b. Moreover, by forming the notch part 36 at the corner portion of the side face 2e and the main face 2d of the laminate 2, the external electrode is divided so as to form the first external electrode 3 and the fourth external electrode 6.

Subsequently, a slit S is formed in the first portion 20 by using a dicing blade or the like. Consequently, the displacement part 50 is configured on the first portion 20. The laminated piezoelectric element 1 is thereby obtained.

As explained above, with the laminated piezoelectric element 1, an opening K is formed in the second portion Q on the first internal electrode 31 and the second internal electrode 32. Since the first and second internal electrodes 31, 32 and the piezoelectric layer 30 are made from different materials, the bonding strength of the first and second internal electrodes 31, 32 and the piezoelectric layer 30 is low in comparison to the bonding strength when the piezoelectric layers 30 are bonded. Thus, as a result of forming the opening K and bonding the piezoelectric layers 30 that face each other across the first internal electrode 31 or the second internal electrode 32 via the opening K, the bonding area of the piezoelectric layers 30 can be increased. Accordingly, it is possible to secure the bonding strength at the displacement part 50 and prevent the displacement part 50 from becoming damaged.

Moreover, since the strength of the displacement part 50 can be secured without having to the broaden the width of the displacement part 50, it is possible to inhibit the opposing area of the internal electrodes from increasing in comparison to the case of securing the strength of the displacement part 50 by broadening the overall width of the displacement part 50, and it is thereby possible to inhibit the capacitance from increasing. Consequently, it is possible to inhibit the current from increasing, and also inhibit the power consumption from increasing.

Second Embodiment

The second embodiment is now explained. (a) of FIG. 6 is a perspective view showing the displacement part of the laminated piezoelectric element according to the second embodiment, and (b) of FIG. 6 is a diagram showing the configuration of the internal electrode disposed in the displacement part illustrated in (a) of FIG. 6.

As shown in FIG. 6, the displacement part 50A formed on the first portion 20 substantially has a T shape when viewed from the laminating direction (Z direction), and the length of the first direction (Y direction) orthogonal to the laminating direction is longer than the length of the second direction (X direction) which is orthogonal to the first direction and the laminating direction. Moreover, the displacement part 50A substantially has a rectangular shape when viewed from the first direction.

The displacement part 50A is configured from an elongated center part 50Aa, and end parts 50Ab, 50Ac. The end part 50Ab is protruding to either end of the center part 50Aa in the second direction (width direction) on one end side (first side face 2e side or second side face 2f side) of the center part 50Aa in the first direction. In other words, the width D1 of the end part 50Ab of the displacement part 50A is broader than the width D2 of the center part 50Aa. The width of the end part 50Ac of the displacement part 50A is the same as the width D2 of the center part 50Aa.

As shown in (b) of FIG. 6, the first internal electrode 31A has a shape which corresponds to the shape of the displacement part 50A. In other words, the first internal electrode 31A substantially has a T shape in a top view, and the width of one end part in the first direction is broader than the width of the center part. An opening K is formed in the second portion Q of the first internal electrode 31A; that is, on the end part 31Aa on the first side face 2e side. The opening K substantially has a rectangular shape, and is formed in the center part of the end part 31Aa of the first internal electrode 31A.

The second internal electrode 32A has a shape which corresponds to the shape of the displacement part 50A. In other words, the second internal electrode 32A substantially has a T shape in a top view, and the width of one end part in the first direction is broader than the width of the center part. An opening K is formed in the second portion Q of the second internal electrode 32A; that is, on the end part 32Aa on the second side face 2f side. The opening K substantially has a rectangular shape, and is formed in the center part of the end part 32Aa of the first internal electrode 32A.

As explained above, with the displacement part 50A, an opening K is formed in the second portion Q in the first internal electrode 31A and the second internal electrode 32A. Thus, as a result of forming the opening K and bonding the piezoelectric layers 30 that face each other across the first internal electrode 31A or the second internal electrode 32A via the opening K, the bonding area of the piezoelectric layers 30 can be increased. Accordingly, it is possible to secure the bonding strength at the displacement part 50A and prevent the displacement part 50A from becoming damaged. Moreover, since the end part 50Ab of the displacement part 50A in the first direction is formed broadly, it is possible to inhibit the opposing area of the first internal electrode 31A and the second internal electrode 32A from increasing in comparison to the case of securing the strength of the displacement part 50A by broadening the overall width of the displacement part 50A, and it is thereby possible to inhibit the capacitance from increasing. Consequently, it is possible to inhibit the current from increasing, and also inhibit the power consumption from increasing.

Moreover, with the displacement part 50A, the width D1 of the end part 50Ab is broader than the width D2 of the center part 50Aa. Consequently, with the displacement part 50A, the strength on the base part 51 side is secured at the end part 50Ab in the first direction. Accordingly, since the strength on the base end part side of the frangible displacement part 50A is secured, it is possible to prevent the displacement part 50A from becoming damaged.

Third Embodiment

The third embodiment is now explained. (a) of FIG. 7 is a perspective view showing the displacement part of the laminated piezoelectric element according to the third embodiment, and (b) of FIG. 7 is a diagram showing the configuration of the internal electrode disposed in the displacement part illustrated in (a) of FIG. 7.

As shown in FIG. 7, the displacement part 50B substantially has an L shape when viewed from the laminating direction (Z direction), and the length of the first direction (Y direction) which is orthogonal to the laminating direction is longer than the length of the second direction (X direction)

which is orthogonal to the first direction and the laminating direction. Moreover, the displacement part 50B substantially has a rectangular shape when viewed from the first direction.

The displacement part 50B is configured from an elongated center part 50Ba, and end parts 50Bb, 50Bc. The end part 50Bb is protruding to one end of the center part 50Ba in the second direction (width direction) on one end side (first side face 2e side or second side face 2f side) of the center part 50Ba in the first direction. In other words, the width D1 of the end part 50Bb of the displacement part 50 is broader than the width D2 of the center part 50Ba. The width of the end part 50Bc of the displacement part 50 is the same as the width D2 of the center part 50Ba.

As shown in (b) of FIG. 7, the first internal electrode 31B has a shape which corresponds to the shape of the displacement part 50B. In other words, the first internal electrode 31B substantially has an L shape in a top view, and the width of one end part in the first direction is broader than the width of the center part. An opening K is formed in the second portion Q of the first internal electrode 31B; that is, on the end part 31Ba on the first side face 2e side. The opening K substantially has a rectangular shape, and is formed in one end side of the end part 31Ba of the first internal electrode 31B in the width direction.

The second internal electrode 32B has a shape which corresponds to the shape of the displacement part 50B. In other words, the second internal electrode 32B substantially has an L shape in a top view, and the width of one end part in the first direction is broader than the width of the center part. An opening K is formed in the second portion Q of the second internal electrode 32B; that is, on the end part 32Ba on the second side face 2f side. The opening K substantially has a rectangular shape, and is formed in one end side of the end part 32Ba of the first internal electrode 32B in the width direction.

As explained above, with the displacement part 50B, an opening K is formed in the second portion Q in the first internal electrode 31B and the second internal electrode 32B. Thus, as a result of forming the opening K and bonding the piezoelectric layers 30 that face each other across the first internal electrode 31B or the second internal electrode 32B via the opening K, the bonding area of the piezoelectric layers 30 can be increased. Accordingly, it is possible to secure the bonding strength at the displacement part 50B and prevent the displacement part 50B from becoming damaged. Moreover, since the end part 50Bb of the displacement part 50B in the first direction is formed broadly, it is possible to inhibit the opposing area of the first internal electrode 31B and the second internal electrode 32B from increasing in comparison to the case of securing the strength of the displacement part 50B by broadening the overall width of the displacement part 50B, and it is thereby possible to inhibit the capacitance from increasing. Consequently, it is possible to inhibit the current from increasing, and also inhibit the power consumption from increasing.

Moreover, with the displacement part 50B, the width D1 of the end part 50Bb is broader than the width D2 of the center part 50Ba. Consequently, with the displacement part 50B, the strength on the base part 51 side is secured at the end part 50Bb in the first direction. Accordingly, since the strength on the base end part side of the frangible displacement part 50B is secured, it is possible to prevent the displacement part 50B from becoming damaged.

Fourth Embodiment

The fourth embodiment is now explained. (a) of FIG. 8 is a perspective view showing the displacement part of the laminated piezoelectric element according to the fourth embodiment, and (b) of FIG. 8 is a diagram showing the configuration of the internal electrode disposed in the displacement part illustrated in (a) of FIG. 8.

As shown in FIG. 8, the displacement part 50C formed in the first portion 20 substantially has an I shape when viewed from the laminating direction (Z direction), and the length of the first direction (Y direction) which is orthogonal to the laminating direction is longer than the length of the second direction (X direction) which is orthogonal to the first direction and the laminating direction. Moreover, the displacement part 50C substantially has a rectangular shape when viewed from the first direction.

With the displacement part 50, as shown in (a) of FIG. 8, the width D1 of both end parts in the first direction is broader than the width D2 of the center part. Specifically, the displacement part 50C is configured from an elongated center part 50Ca, and end parts 50Cb, 50Cc. The end parts 50Cb, 50Cc are protruding to either side of the center part 50Ca in the second direction (width direction) at either end side of the center part 50Ca in the first direction (extending direction). In other words, the width D1 of both end parts 50Cb, 50Cc of the displacement part 50 is broader than the width D2 of the center part 50Ca.

As shown in (b) of FIG. 8, the first internal electrode 31C substantially has an T shape in a top view, and the width of one end part in the first direction is broader than the width of the center part. An opening K is formed in the second portion Q of the first internal electrode 31C; that is, on the end part 31Ca on the first side face 2e side. The opening K substantially has a rectangular shape, and a plurality of openings K (five in this example) are formed in the end part 31Ca of the first internal electrode 31C in the width direction.

The second internal electrode 32C substantially has an T shape in a top view, and the width of one end part in the first direction is broader than the width of the center part. An opening K is formed in the second portion Q of the second internal electrode 32C; that is, on the end part 32Ca on the second side face 2f side. The opening K substantially has a rectangular shape, and a plurality of openings K (five in this example) are formed in the end part 32Ca of the second internal electrode 32C in the width direction.

As explained above, with the displacement part 50C, an opening K is formed in the second portion Q in the first internal electrode 31C and the second internal electrode 32C. Thus, as a result of forming the opening K and bonding the piezoelectric layers 30 that face each other across the first internal electrode 31C or the second internal electrode 32C via the opening K, the bonding area of the piezoelectric layers 30 can be increased. Accordingly, it is possible to secure the bonding strength at the displacement part 50C and prevent the displacement part 50C from, becoming damaged. Moreover, since both end parts 50Cb, 50Cc of the displacement part 50C in the first direction are formed broadly, it is possible to inhibit the opposing area of the first internal electrode 31C and the second internal electrode 32C from increasing in comparison to the case of securing the strength of the displacement part 50C by broadening the overall width of the displacement part 50C, and it is thereby possible to inhibit the capacitance from increasing. Consequently, it is possible to inhibit the current from increasing, and also inhibit the power consumption from increasing.

Moreover, with the displacement part 50C, the width D1 of the end parts 50Cb, 50Cc is broader than the width D2 of the center part 50Ca. Consequently, with the displacement part 50C, the strength on the base part 51 side is secured at both end parts 50Cb, 50Cc in the first direction. Accordingly, since the strength on the base end part side of the frangible displacement part 50C is secured, it is possible to prevent the displacement part 50C from becoming damaged.

Fifth Embodiment

The fifth embodiment is now explained. (a) of FIG. 9 is a perspective view showing the displacement part of the laminated piezoelectric element according to the fifth embodiment, and (b) of FIG. 9 is a diagram showing the configuration of the internal electrode disposed in the displacement part illustrated in (a) of FIG. 9.

As shown in FIG. 9, the displacement part 50D substantially has a trapezoidal shape when viewed from the laminating direction (Z direction), and the length of the first direction (Y direction) which is orthogonal to the laminating direction is longer than the length of the second direction (X direction) which is orthogonal to the first direction and the laminating direction. Moreover, the displacement part 50D substantially has a rectangular shape when viewed from the first direction.

With the displacement part 50D, the width becomes broader from one end part side in the first direction toward the other end part side. In other words, with the displacement part 50D, the width D1 of the end part 50Db is broader than the width D2 of the center part 50Da, and the width of the end part 50Dc on a side that is opposite to the end part 50Db is narrower than the width D2 of the center part 50Da (D1>D2>D3).

As shown in (b) of FIG. 9, the first internal electrode 31D has a shape which corresponds to the shape of the displacement part 50D. In other words, the first internal electrode 31D substantially has a trapezoidal shape in a top view, and the width of both end parts in the first direction is broader than the width of the center part. An opening K is formed in the second portion Q of the first internal electrode 31D; that is, on the end part 32Da on the first side face 2e side. The opening K substantially has a rectangular shape, and a plurality of openings K (two in this example) are formed in the end part 31Da of the first internal electrode 31D along the width direction.

The second internal electrode 32D has a shape which corresponds to the shape of the displacement part 50D. In other words, the second internal electrode 32D substantially has a trapezoidal shape in a top view, and the width of both end parts in the first direction is broader than the width of the center part. An opening K is formed in the second portion Q of the second internal electrode 32D; that is, on the end part 32Da on the second side face 2f side. The opening K substantially has a rectangular shape, and a plurality of openings K (two in this example) are formed in the end part 32Da of the second internal electrode 32D along the width direction.

In the displacement part 50D, as explained above, an opening K is formed in the second portion Q in the first internal electrode 31D and the second internal electrode 32D. Thus, as a result of forming the opening K and bonding the piezoelectric layers 30 that face each other across the first internal electrode 31D or the second internal electrode 32D via the opening K, the bonding area of the piezoelectric layers 30 can be increased. Accordingly, it is possible to secure the bonding strength at the displacement part 50D and prevent the displacement part 50D from becoming damaged. Moreover, since the end part 50Db of the displacement part 50D in the first direction is formed broadly, it is possible to inhibit the opposing area of the first internal electrode 31D and the second internal electrode 32D from increasing in comparison to the case of securing the strength of the displacement part 50D by broadening the overall width of the displacement part 50D, and it is thereby possible to inhibit the capacitance from increasing. Consequently, it is possible to inhibit the current from increasing, and also inhibit the power consumption from increasing.

Moreover, with the displacement part 50D, the width D1 of the end part 50Db is broader than the width D2 of the center part 50Da. Consequently, with the displacement part 50D, the strength on the base part 51 side is secured at the end part 50Db in the first direction. Accordingly, since the strength on the base end part side of the frangible displacement part 50D is secured, it is possible to prevent the displacement part 50D from becoming damaged.

The present invention is not limited to the foregoing embodiments. For example, while the foregoing embodiments explained a case where the laminate 2 is configured by including the first portion 20, the second portion 21a and the third portion 21b, the configuration of the laminate 2 is not limited thereto.

Moreover, with the foregoing embodiments, while the fourth external electrode 6 for connecting the second external electrode 4 and the third external electrodes 5a, 5b are formed on the second main face 2d of the laminate 2, the fourth external electrode 6 does not need to be provided. In other words, the second external electrode 4 and the third external electrodes 5a, 5b may be connected with only the third internal electrode 33.

Moreover, with the foregoing embodiments, while an opening is formed in the second portion of the first and second internal electrodes, an opening may also be formed in the first portion. In the foregoing case, preferably, the opening is formed in the first and second internal electrodes on the base end part side (base part 51 side) of the displacement part. According to the foregoing configuration, it is possible to reduce the influence on the displacement characteristics of the displacement part.

What is claimed is:

1. A piezoelectric element, comprising:
 a base part that is configured from a piezoelectric layer; and
 a laminate that is configured by a first internal electrode and a second internal electrode, which are alternately laminated with the piezoelectric layer interposed therebetween, and that includes a displacement part extending from the base part in a laminating direction of the first internal electrode and the second internal electrode, wherein
 the displacement part has a shape in which, when viewed from the laminating direction, a length of a first direction which is orthogonal to the laminating direction is longer than a length of a second direction which is orthogonal to the first direction and the laminating direction,
 the displacement part includes a first portion in which the first internal electrode and the second internal electrode overlap in the laminating direction, and a second portion in which the first internal electrode and the second internal electrode do not overlap in the laminating direction,
 an opening is formed in at least one of the first internal electrode and the second internal electrode in the second portion, and
 the piezoelectric layer is disposed in the opening so that portions of the piezoelectric layer that face each other across the first internal electrode or the second internal electrode are bonded via the opening.

2. The piezoelectric element according to claim 1, wherein the at least one of the first internal electrode and the second internal electrode in which the opening is formed is disposed on a base part side of the displacement part.

3. The piezoelectric element according to claim 1, wherein an opening is formed in at least one of the first internal electrode and the second internal electrode in the first portion, the at least one electrode in which the opening in the first portion is formed being disposed on a base part side of the displacement part.

* * * * *